United States Patent
Maeda et al.

(10) Patent No.: US 9,237,656 B2
(45) Date of Patent: Jan. 12, 2016

(54) METHOD OF MANUFACTURING MULTI-LAYER WIRING BOARD

(71) Applicant: NGK SPARK PLUG CO., LTD., Nagoya-shi, Aichi-ken (JP)

(72) Inventors: Shinnosuke Maeda, Nagoya (JP); Tetsuo Suzuki, Takahama (JP); Takuya Hando, Inuyama (JP); Atsuhiko Sugimoto, Kagamigahara (JP); Satoshi Hirano, Chita-gun (JP); Hajime Saiki, Cupertino, CA (US)

(73) Assignee: NGK SPARK PLUG CO., LTD., Nagoya (JP)

( * ) Notice: Subject to any disclaimer, the term of this patent is extended or adjusted under 35 U.S.C. 154(b) by 141 days.

(21) Appl. No.: 13/721,556

(22) Filed: Dec. 20, 2012

(65) Prior Publication Data

US 2013/0160290 A1 Jun. 27, 2013

(30) Foreign Application Priority Data

Dec. 26, 2011 (JP) ................................. 2011-284389

(51) Int. Cl.
*H05K 3/10* (2006.01)
*H05K 3/46* (2006.01)
*H05K 3/00* (2006.01)

(52) U.S. Cl.
CPC ................ *H05K 3/10* (2013.01); *H05K 3/0097* (2013.01); *H05K 3/4673* (2013.01);
(Continued)

(58) Field of Classification Search
CPC ..... H05K 3/10; H05K 3/0035; H05K 3/4673; H05K 3/4682; H05K 3/0097; H05K 2203/1536; H05K 2203/0156; H05K 2203/061; Y10T 29/49155; Y10T 29/49124; Y10T 29/49117; Y10T 29/49002
USPC ......... 29/846, 829, 825, 592.1; 174/260, 255, 174/257, 258, 251, 261, 262, 438, 460, 107; 174/108, 601, 114, 112
See application file for complete search history.

(56) References Cited

U.S. PATENT DOCUMENTS 7,597,929 B2 10/2009 Kyozuka
7,977,580 B2 7/2011 Ueno et al.
(Continued)

FOREIGN PATENT DOCUMENTS

JP S61133695 A 6/1986
JP 11-233937 A 8/1999
(Continued)

OTHER PUBLICATIONS

Japanese Patent Office, Notification of Reason for Rejection, in Corresponding JP Application No. 2011-284389, mailed on Mar. 24, 2015.
(Continued)

*Primary Examiner* — Peter DungBa Vo
*Assistant Examiner* — Azm Parvez
(74) *Attorney, Agent, or Firm* — Stites & Harbison, PLLC; Jeffrey A. Haeberlin; James R. Hayne

(57) ABSTRACT

Embodiments of the presently-disclosed subject matter include a first laminated structure in which at least one conductor layer and at least one resin insulating layer are alternately formed is formed on a supporting substrate, and a core substrate is formed so as to come into contact with the conductor layer which is the uppermost layer of the first laminated structure. Then, laser light is emitted to the core substrate to form a through hole and a metal layer is formed in the through hole. Then, a second laminated structure including at least one conductor layer and at least one resin insulating layer is formed on the core substrate. At that time, the thickness of the conductor layer which is the uppermost layer of the first laminated structure is greater than that of the other conductor layers.

3 Claims, 17 Drawing Sheets

(52) U.S. Cl.
CPC ........... *H05K 3/4682* (2013.01); *H05K 3/0035* (2013.01); *H05K 2203/0156* (2013.01); *H05K 2203/061* (2013.01); *H05K 2203/1536* (2013.01); *Y10T 29/49124* (2015.01); *Y10T 29/49155* (2015.01)

(56) References Cited

U.S. PATENT DOCUMENTS

| | | | | |
|---|---|---|---|---|
| 8,450,617 | B2 * | 5/2013 | Maeda | H01L 23/49822 174/255 |
| 8,581,388 | B2 * | 11/2013 | Maeda | H01L 23/49811 257/700 |
| 2007/0057363 | A1 | 3/2007 | Nakamura et al. | |
| 2007/0119619 | A1 | 5/2007 | Nakamura et al. | |
| 2007/0190237 | A1 | 8/2007 | Kyozuka | |
| 2009/0294156 | A1 | 12/2009 | Ueno et al. | |
| 2012/0097319 | A1 * | 4/2012 | Maeda | H01L 21/4857 156/151 |

FOREIGN PATENT DOCUMENTS

| | | |
|---|---|---|
| JP | H11346058 A | 12/1999 |
| JP | 200773766 A | 3/2007 |
| JP | 200796260 A | 4/2007 |
| JP | 2007-214427 A | 8/2007 |
| JP | 2009-289848 A | 12/2009 |
| TW | 200730062 A | 8/2007 |
| TW | 201008402 A | 2/2010 |

OTHER PUBLICATIONS

Taiwan Intellectual Property Office, Notification for the Opinion of Examination, in Corresponding TW Application No. 101149671, mailed Apr. 27, 2015.

* cited by examiner

METHOD OF MANUFACTURING MULTI-LAYER WIRING BOARD

CROSS REFERENCE TO RELATED APPLICATIONS

The present application claims priority to Japanese Patent Application No. 2011-284389, which was filed on Dec. 26, 2011, the disclosure of which is herein incorporated by reference in its entirety.

BACKGROUND OF THE INVENTION

1. Field of the Invention

The present invention relates to a method of manufacturing a multi-layer wiring board.

2. Description of Relate Art

In general, as a package having electronic components mounted thereon, a multi-layer wiring board has been used in which resin insulating layers and conductor layers are alternately formed on both sides of a core substrate to form buildup layers (JP-A-11-233937). In the multi-layer wiring board the core substrate is made of a resin including, for example, a glass fiber, that has high rigidity and reinforces the buildup layers. However, since the core substrate has a large thickness, it hinders a reduction in the size of the multi-layer wiring board. Therefore, in recent years, the thickness of the core substrate has been reduced to reduce the size of the multi-layer wiring board.

However, when the thickness of the core substrate is reduced, the strength of an assembly including the core substrate is reduced during a manufacturing process and it is difficult to horizontally convey the core substrate or the assembly. During conveyance, the core substrate or the assembly (substrate which is being manufactured and will be the multi-layer wiring board) comes into contact with a conveyance mechanism and is damaged. In addition, the core substrate or the assembly is fixed in each manufacturing process. When the core substrate or the assembly is provided to a predetermined manufacturing process, it is bent, which makes it difficult to perform, for example, a plating process with high accuracy. As a result, in the multi-layer wiring board including the core substrate, when the thickness of the core substrate is reduced, the manufacturing yield of the multi-layer wiring board is reduced.

From this point of view, a so-called coreless multi-layer wiring board has been proposed which does not include a core substrate, is suitable to reduce the size, and is capable of improving the transmission performance of a high-frequency signal (JP-A-2009-289848 and JP-A-2007-214427). For example, the coreless multi-layer wiring board is formed as follows. A buildup layer is formed on a supporting substrate on which a release sheet, which is a laminate of two separable metal films, is formed and the release sheet peels off at the peeling interface between the two metal films to separate the buildup layer from the supporting substrate. In this way, a desired multi-layer wiring board is obtained.

However, since no core layer is provided in the coreless multi-layer wiring board, the strength of the coreless multi-layer wiring board is weak and the coreless multi-layer wiring board requires careful handling. In addition, the purpose of the coreless multi-layer wiring board is limited.

BRIEF SUMMARY OF THE INVENTION

An object of the invention is to provide a manufacturing method which can reduce the thickness of a core substrate in a multi-layer wiring board in which laminated structures, each having at least one conductor layer and at least one resin insulating layer alternately formed, are formed on both surfaces of the core substrate and reduce the size of the multi-layer wiring board, without reducing manufacturing yield.

In order to achieve the object, according to an aspect of the invention, there is provided a method of manufacturing a multi-layer wiring board. The method includes: forming, on a supporting substrate, a first laminated structure in which at least one conductor layer and at least one resin insulating layer are alternately formed; forming a core substrate on the first laminated structure so as to come into contact with the conductor layer which is an uppermost layer of the first laminated structure; forming a through hole by emitting laser light to the core substrate; forming a through hole metal layer on at least an inner circumferential surface of the through hole; and forming a second laminated structure in which at least one conductor layer and at least one resin insulating layer are alternately formed on the core substrate having the through hole metal layer formed thereon. A thickness of the conductor layer which is the uppermost layer of the first laminated structure is greater than a thickness of the other conductor layers.

According to the aspect of the invention, in a method of manufacturing a so-called coreless multi-layer wiring board in which the laminated structure of at least one conductor layer and at least one resin insulating layer is formed on the supporting substrate, the core substrate is laminated together with the laminated structure and an additional laminated structure of at least one conductor layer and at least one resin insulating layer is formed on the core substrate. After the laminated structure is formed on the supporting substrate as described above, the supporting substrate is removed. Therefore, finally, the core substrate is interposed between the first laminated structure including a plurality of conductor layers and a plurality of resin insulating layers and the second laminated structure including at least one conductor layer and at least one resin insulating layer, that is, the multi-layer wiring board including the core substrate remains.

In the aspect of the invention, the multi-layer wiring board including the core substrate with a thickness of 200 μm or less is manufactured by the method of manufacturing the coreless multi-layer wiring board, as described above. Therefore, in the manufacturing process, the laminated structure or the core substrate is formed on the supporting substrate. Therefore, even when the thickness of the core substrate is small, the thickness of the supporting substrate is sufficiently large and the strength of the assembly is not reduced during the manufacturing process.

Therefore, it is possible to horizontally convey the assembly which is being manufactured and prevent the contact of the assembly with the conveyance mechanism during conveyance. As a result, it is possible to prevent the damage of the core substrate or the assembly. In addition, it is possible to avoid the problem that the assembly is fixed in each manufacturing process and the assembly is bent when it is provided to a predetermined manufacturing process, which makes it difficult to perform, for example, the plating process with high accuracy. Therefore, it is possible to manufacture the multi-layer wiring board including a thin core substrate with high yield and reduce the size of the multi-layer wiring board including the core substrate.

The above-mentioned manufacturing method is not limited to the manufacture of the multi-layer wiring board including the core substrate in which the core substrate is thin and the core substrate or the assembly which is being manufactured is bent by a general manufacturing method, which results in a reduction in manufacturing yield, but may be applied to a case in which the core substrate is thick and the multi-layer wiring board including the core substrate can be manufactured with a higher yield than that in the general manufacturing method.

In the above-mentioned aspect of the invention, the through hole is formed in the core substrate and the through hole metal layer is formed on at least the inner circumferential surface of the through hole, in order to electrically connect the first laminated structure and the second laminated structure which are formed on both sides of the core substrate.

Laser light is emitted to the core substrate to form the through hole. However, the core substrate can be thick and include a reinforced fiber, such as a glass fiber. Therefore, the irradiation energy of the laser light needs to increase. However, it is difficult to control the irradiation energy. When the irradiation energy of the laser light is more than necessary, the laser light passes through the core substrate and reaches the conductor layer and the resin insulating layer of the first laminated structure which is disposed below the core substrate. As a result, an opening is likely to be formed in the resin insulating layer.

In this case, when the through hole metal layer is formed on at least the inner circumferential surface of the through hole, in some cases, it is formed in the opening of the resin insulating layer in the first laminated structure and is electrically connected to the conductor layer disposed below the resin insulating layer. As a result, it can be difficult to achieve the designed electrical connection of the multi-layer wiring board including the first laminated structure, the core substrate, and the second laminated structure.

However, in the above-mentioned aspect of the invention, the thickness of the conductor layer, which is the uppermost layer of the first laminated structure and that is provided below the core substrate is greater than that of the other conductor layers of the first laminated structure and the conductor layer of the second laminated structure. Therefore, as described above, even when the irradiation energy of the laser light for forming the through holes in the core substrate is more than necessary, the laser light is shielded by the conductor layer which is the uppermost layer of the first laminated structure, and the laser light does not reach the resin insulating layer of the first laminated structure. As a result, it is possible to avoid the above-mentioned problem that it is difficult to achieve the designed electrical connection of the multi-layer wiring board.

When the thickness of the conductor layer which is the uppermost layer of the first laminated structure increases, the depth of the through hole to be formed in the core substrate is reduced, which makes it possible to reduce the irradiation energy of the laser light required to form the through hole to some extent. That is, the above-mentioned operation and effect can be remarkable due to the synergy between the increase in the thickness of the conductor layer, which is the uppermost layer, and the reduction in the intensity of laser light associated with the increase in the thickness.

According to the above-mentioned aspect of the invention, the method can further comprise forming a metal layer, before the step of forming the through hole, on an upper main surface of the core substrate, and removing a portion of the metal layer which is disposed immediately above a portion of the core substrate in which the through hole will be formed. In this case, since the metal layer is not provided in the portion in which the through hole will be formed, for example, it is possible to reduce the irradiation energy of the laser light required to form the through hole and reduce the manufacturing costs of the multi-layer wiring board including the core substrate. In addition, even when the thickness of the conductor layer which is the uppermost layer of the first laminated structure is reduced to some extent, it is possible to avoid the problem that the laser light passes through the core substrate and reaches the resin insulating layer of the first laminated structure, which makes it difficult to achieve the designed electrical connection of the multi-layer wiring board.

In the above-mentioned aspect of the invention, the conductor layer which is the uppermost layer of the first laminated structure may be formed only in a region which is disposed immediately below a portion of the core substrate in which the through hole will be formed. In this case, only a portion of the conductor layer which comes into contact with, for example, the plated layer formed in the through hole, that is, only a pad portion may be formed to be thick. Therefore, it is possible to easily design the circuit of the multi-layer wiring board including the first laminated structure, the core substrate, and the second laminated structure.

As described above, according to the aspect of the invention, it is possible to provide a manufacturing method which can reduce the thickness of a core substrate in a multi-layer wiring board in which laminated structures, each having at least one conductor layer and at least one resin insulating layer alternately formed, are formed on both surface of the core substrate and reduce the size of the multi-layer wiring board, without reducing manufacturing yield.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

An exemplary embodiment of the present invention will next be described with reference to the drawings. However, the exemplary embodiment to be described below is a mere example of an application of the technical concept of the present invention. The contents of the exemplary embodiment should not be construed as limiting the invention.

Figure 1:
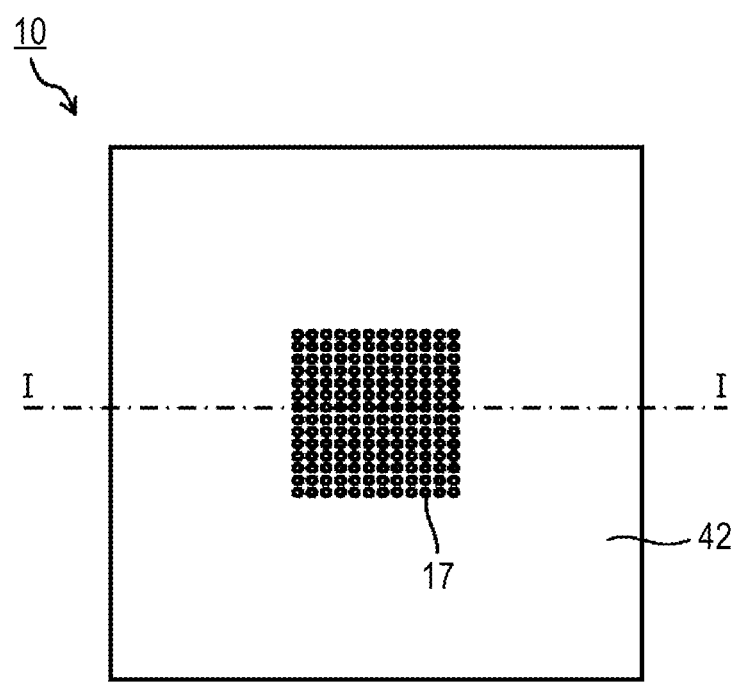
FIG. 1 is a plan view illustrating a multi-layer wiring board according to an embodiment.
Figure 2:
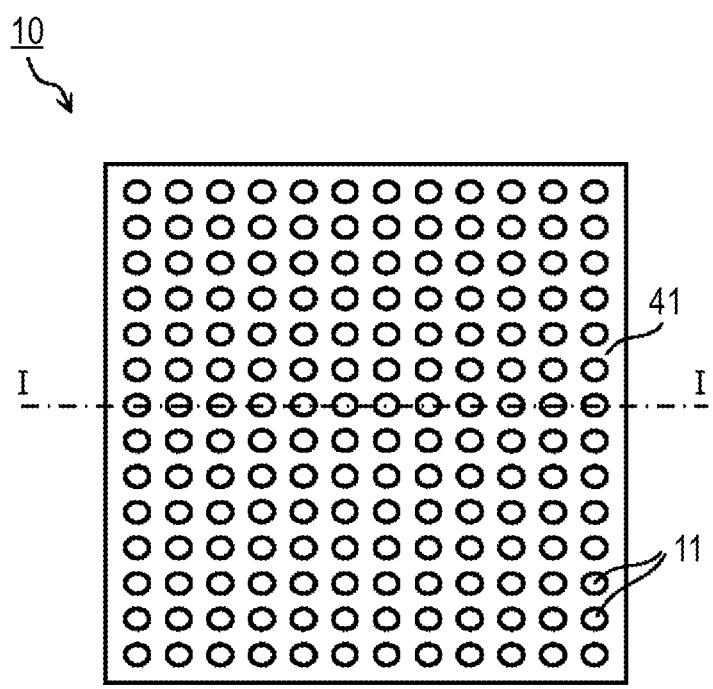
FIG. 2 is a plan view illustrating the multi-layer wiring board according to the embodiment.
Figure 3:
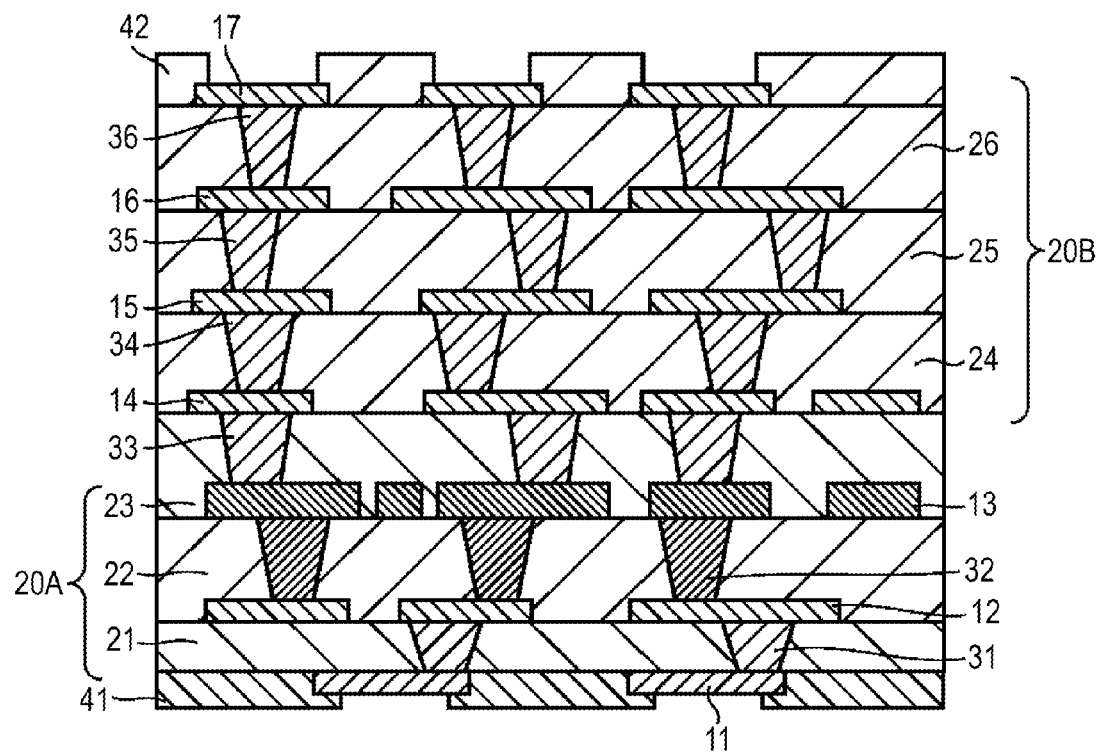
FIG. 3 is an enlarged cross-sectional view illustrating a portion of the multi-layer wiring board taken along the line I-I of FIGS. 1 and 2.

First, an example of a multi-layer wiring board manufactured by a method according to the embodiment of the invention will be described. FIGS. 1 and 2 are plan views illustrating the multi-layer wiring board according to this embodiment. FIG. 1 shows the state of the multi-layer wiring board, as viewed from the upper side, and FIG. 2 shows the state of the multi-layer wiring board, as viewed from the lower side. FIG. 3 is an enlarged cross-sectional view illustrating a portion of the multi-layer wiring board taken along the line I-I of FIGS. 1 and 2.

However, the following multi-layer wiring board is exemplified in order to clarify the characteristics of the invention, but the structure of the multi-layer wiring board is not particularly limited as long as the multi-layer wiring board has the following structure: a core substrate is interposed between a first laminated structure including at least one conductor layer and at least one resin insulating layer which are alternately formed and a second laminated structure including at least one conductor layer and at least one resin insulating layer which are alternately formed.

A multi-layer wiring board 10 shown in FIGS. 1 to 3 includes first to seventh conductor layers 11 to 17 and first to sixth resin insulating layers 21 to 26 which are alternately formed.

Specifically, the first resin insulating layer 21 is formed on the first conductor layer 11. The second conductor layer 12 is formed on the first resin insulating layer 21. The second resin insulating layer 22 is formed on the second conductor layer 12. The third conductor layer 13 is formed on the second resin insulating layer 22. The third resin insulating layer 23 is formed on the third conductor layer 13. The fourth conductor layer 14 is formed on the third resin insulating layer 23. The fourth resin insulating layer 24 is formed on the fourth conductor layer 14. The fifth conductor layer 15 is formed on the fourth resin insulating layer 24. The fifth resin insulating layer 25 is formed on the fifth conductor layer 15. The sixth conductor layer 16 is formed on the fifth resin insulating layer 25. The sixth resin insulating layer 26 is formed on the sixth conductor layer 16. The seventh conductor layer 17 is formed on the sixth resin insulating layer 26.

The first to seventh conductor layers 11 to 17 are made of a conductor with high electrical conductivity, such as copper. The first resin insulating layer 21, the second resin insulating layer 22, and the fourth to sixth resin insulating layers 24 to 26 are made of a thermosetting resin composition including a silica filler, if necessary. The third resin insulating layer 23 forms a plate-shaped core substrate, such as a heat-resistant resin plate (for example, a bismaleimide-triazine resin plate) or a fiber reinforced resin plate (for example, a glass fiber reinforced epoxy resin).

In addition, a first resist layer 41 is formed on the first conductor layer 11 such that the first conductor layer 11 is partially exposed, and a second resist layer 42 is formed on the seventh conductor layer 17 such that the seventh conductor layer 17 is partially exposed.

A portion of the first conductor layer 11 which is exposed from the first resist layer 41 functions as a rear land (LGA pad) for connecting the multi-layer wiring board 10 to a motherboard and is arranged in a rectangular shape on the rear surface of the multi-layer wiring board 10. A portion of the seventh conductor layer 17 which is exposed from the second resist layer 42 functions as a pad (FC pad) for flip-chip interconnection between a semiconductor element (not shown) and the multi-layer wiring board 10, forms a semiconductor element mounting region, and is arranged in a rectangular shape substantially at the center of the surface of the multi-layer wiring board 10.

First via conductors 31 are formed in the first resin insulating layer 21 and electrically connect the first conductor layer 11 and the second conductor layer 12. Second via conductors 32 are formed in the second resin insulating layer 22 and electrically connect the second conductor layer 12 and the third conductor layer 13. Similarly, third via conductors 33 are formed in the third resin insulating layer 23 and electrically connect the third conductor layer 13 and the fourth conductor layer 14. Fourth via conductors 34 are formed in the fourth resin insulating layer 24 and electrically connect the fourth conductor layer 14 and the fifth conductor layer 15. In addition, fifth via conductors 35 are formed in the fifth resin insulating layer 25 and electrically connect the fifth conductor layer 15 and the sixth conductor layer 16. Sixth via conductors 36 are formed in the sixth resin insulating layer 26 and electrically connect the sixth conductor layer 16 and the seventh conductor layer 17.

In this embodiment, the first to third conductor layers 11 to 13, the first and second resin insulating layers 21 and 22, and the first and second via conductors 31 and 32 form a first laminated structure 20A. The fourth to seventh conductor layers 14 to 17, the fourth to sixth resin insulating layers 24 to 26, and the fourth to sixth via conductors 34 to 36 form a second laminated structure 20B.

Portions (which are not particularly denoted by reference numerals) of the first to seventh conductor layers 11 to 17 which are connected to the first to sixth via conductors 31 to 36 form via lands (via pads), and portions (which are not particularly denoted by reference numerals) of the first to seventh conductor layers 11 to 17 which are not connected to the first to sixth via conductors 31 to 36 form wiring layers.

The multi-layer wiring board 10 may have, for example, a size of 200 mm×200 mm×0.4 mm.

Next, a method of manufacturing the multi-layer wiring board 10 shown in FIGS. 1 to 3 will be described. FIGS. 4 to 16 are process diagrams illustrating the method of manufacturing the multi-layer wiring board 10 according to this embodiment. The process diagrams shown in FIGS. 4 to 16 correspond to the cross-sectional view of the multi-layer wiring board 10 shown in FIG. 3.

In the manufacturing method according to the embodiment of the invention, in practice, the multi-layer wiring boards 10 can be formed on both sides of a supporting substrate. However, in this embodiment, a case in which the multi-layer wiring board 10 is formed only on one side of the supporting substrate will be described in order to clarify the characteristics of the manufacturing method according to the embodiment of the invention.

Figure 4:
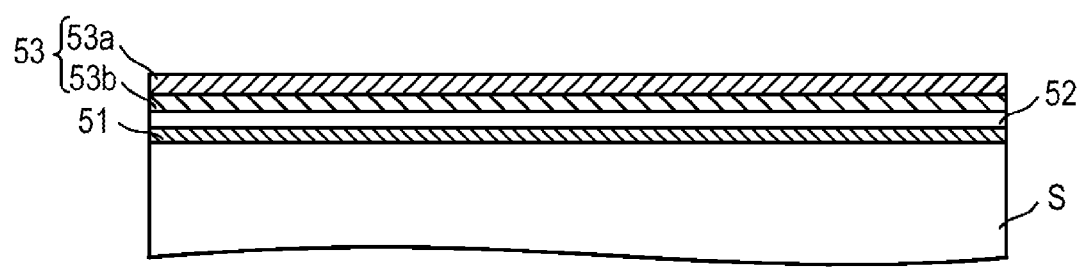
FIG. 4 is a process diagram illustrating a method of manufacturing the multi-layer wiring board according to the embodiment.

First, as shown in FIG. 4, a supporting substrate S having copper thin films 51 attached to both surfaces thereof is prepared. The supporting substrate S may be, for example, a heat-resistant resin plate (for example, a bismaleimide-triazine resin plate) or a fiber reinforced resin plate (for example, a glass fiber reinforced epoxy resin plate). In order to prevent the warping of an assembly which is occurred in a manufacturing process, the thickness of the supporting substrate S may be in the range of, for example, 0.4 mm to 1.0 mm, as described in detail below. Then, release sheets 53 are formed on the copper thin films 51 formed on both surfaces of the supporting substrate S by, for example, vacuum hot press, through a prepreg layer 52 serving as an adhesive layer.

The release sheet 53 includes, for example, a first metal film 53a and a second metal film 53b, and Cr plating is performed between the films such that the films can be peeled off from each other by external shear force. The first metal film 53a and the second metal film 53b may be copper thin films.

Figure 5:
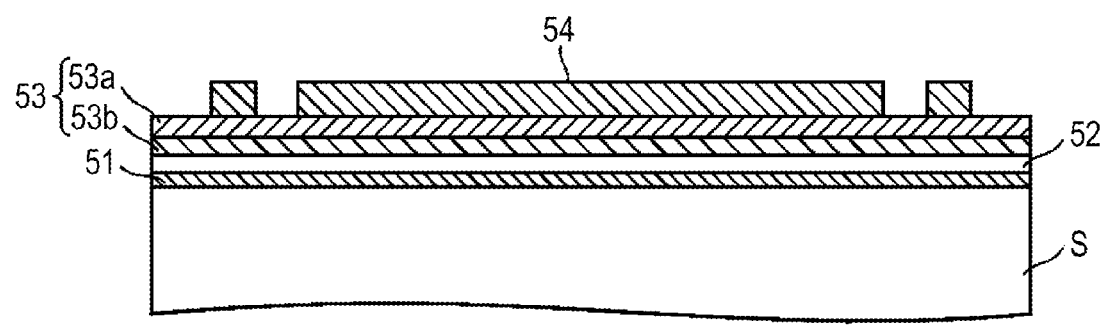
FIG. 5 is a process diagram illustrating the method of manufacturing the multi-layer wiring board according to the embodiment.

Then, as shown in FIG. 5, photosensitive dry films are formed on the release sheets 53 which are formed on both sides of the supporting substrate S and are then exposed and developed to form mask patterns 54. Openings corresponding to alignment mark forming portions Pa and outer circumference demarcation portions Po are formed in the mask pattern 54.

Figure 6:
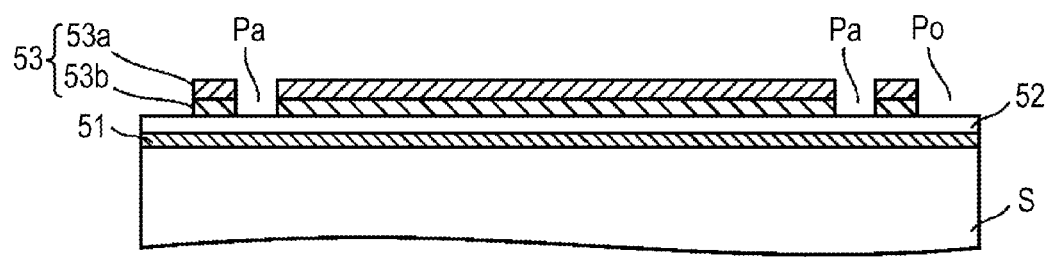
FIG. 6 is a process diagram illustrating the method of manufacturing the multi-layer wiring board according to the embodiment.

Then, as shown in FIG. 6, an etching process is performed for the release sheet 53 on the supporting substrate S through the mask pattern 54 to form the alignment mark forming portions Pa and the outer circumference demarcation portions Po in the release sheet 53 at positions corresponding to the openings. After the alignment mark forming portions Pa and the outer circumference demarcation portions Po are formed, the mask pattern 54 is removed by etching.

It is preferable that the etching process be performed for the surface of the release sheet 53 which is exposed after the mask pattern 54 is removed to roughen the surface. In this way, it is possible to improve the adhesion between the release sheet 53 and the resin insulating layer, which will be described below.

Figure 7:
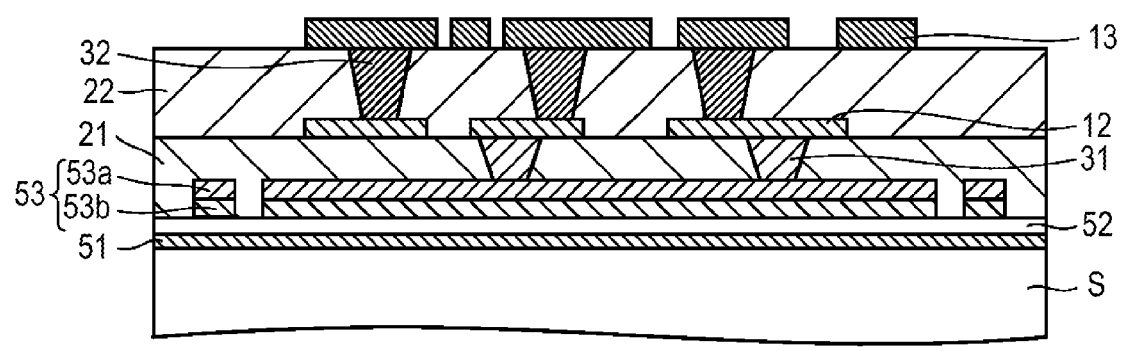
FIG. 7 is a process diagram illustrating the method of manufacturing the multi-layer wiring board according to the embodiment.

Then, as shown in FIG. 7, a resin film is formed on the release sheet 53 and is then heated and pressed under vacuum. Then, the resin film is hardened and the first resin insulating layer 21 is formed. In this way, the surface of the release sheet 53 is covered with the first resin insulating layer 21, and the openings forming the alignment mark forming portions Pa and the cutouts forming the outer circumference demarcation portions Po are filled with the first resin insulating layer 21. Therefore, an alignment mark structure is formed in the alignment mark forming portion Pa.

In addition, the outer circumference demarcation portions Po are covered with the first resin insulating layer 21. Therefore, in the following peeling process using the release sheet 53, the end surface of the release sheet 53 peels off from, for example, the prepreg layer 52 and comes off. As a result, it is possible to avoid the disadvantage that the peeling process is not performed well and it is difficult to manufacture a desired multi-layer wiring board 10.

Then, laser light with a predetermined intensity is emitted from, for example, a $CO_2$ gas laser or a YAG laser to the first resin insulating layer 21 to form via holes. Then, a desmear process and an outline etching process are appropriately performed for the via holes and a roughening process is performed for the first resin insulating layer 21 including the via holes.

In a case in which the first resin insulating layer includes a filler, when the roughening process is performed, the filler is isolated and remains on the first resin insulating layer 21. Therefore, in this case, an appropriate cleaning process with water is performed.

After the cleaning process with water is performed, an air blowing process may be performed. Even when the isolated filler is not completely removed by the cleaning process with water, the air blowing process may be performed to complement the removal of the filler. Then, pattern plating is performed for the first resin insulating layer 21 to form the second conductor layer 12 and the first via conductor 31.

The second conductor layer 12 and the via conductor 31 are formed by a semi-additive method as follows. First, an electroless plating film is formed on the first resin insulating layer 21 and a resist is formed on the electroless plating film. Then, electrolytic copper plating is performed for a portion in which the resist is not formed. After the second conductor layer 12 and the first via conductor 31 are formed, the resist is peeled off and removed by, for example, KOH and the electroless plating film which is exposed by the removal of the resist is removed by etching.

Then, the roughening process is performed for the second conductor layer 12 and a resin film is formed on the first resin insulating layer 21 so as to cover the second conductor layer 12. Then, heat and pressure are applied to the resin film under vacuum to harden the resist film, thereby forming the second resin insulating layer 22. Then, similarly to the first resin insulating layer 21, via holes are formed in the second resin insulating layer 22, and pattern plating is performed to form the third conductor layer 13 and the second via conductor 32.

At that time, a pattern plating processing time is more than that when the second conductor layer 12 and the first via conductor 31 are formed, and the third conductor layer 13 is thicker than the second conductor layer 12, the first conductor layer 11, and the fourth to seventh conductor layers 14 to 17 which are formed by the following manufacturing process. Specifically, the thickness of the third conductor layer 13 is equal to or greater than 15 μm and is preferably equal to or less than half the thickness of the third resin insulating layer forming the core substrate which will be described below.

In this way, the first laminated structure 20A including the first metal film 53a (which will be the first conductor layer 11 later), the second and third conductor layers 12 and 13, the first and second resin insulating layers 21 and 22, and the first and second via conductors 31 and 32 is formed by the processes shown in FIGS. 4 to 7.

Figure 8:
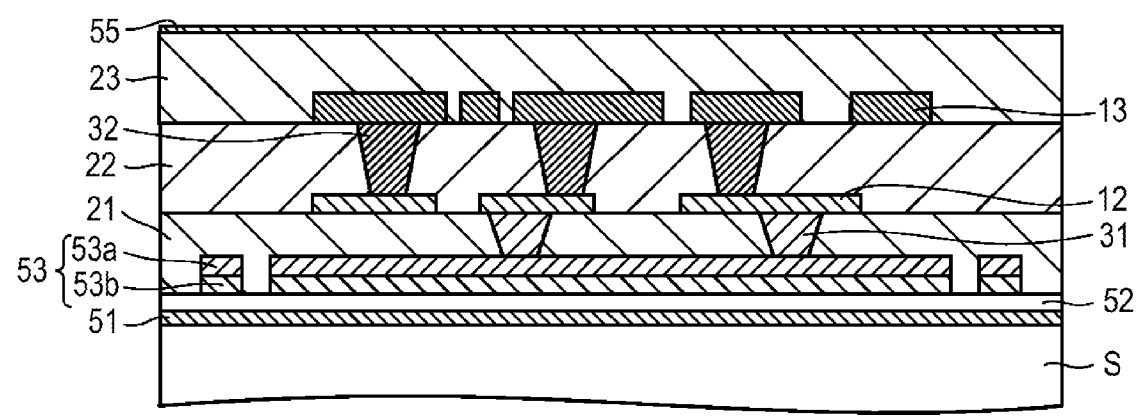
FIG. 8 is a process diagram illustrating the method of manufacturing the multi-layer wiring board according to the embodiment.

Then, as shown in FIG. 8, the third conductor layer 13 is formed on the second resin insulating layer 22 and a prepreg having a metal layer 55 provided on the upper main surface thereof is formed such that the lower main surface of the prepreg comes into contact with the second resin insulating layer 22. Then, vacuum hot press is performed to press and harden the second resin insulating layer 22. Since the prepreg includes a reinforced fiber, such as a glass fiber, the third resin insulating layer 23 obtained by heating and hardening the prepreg forms the core substrate.

The vacuum hot press is performed at a temperature equal to or more than the glass transition temperature of the first resin insulating layer 21 and the second resin insulating layer 22 forming the first laminated structure 20A. Therefore, when the core substrate including the metal layer 55 and the third resin insulating layer is formed on the first laminated structure 20A, it is possible to prevent the warping of the first laminated structure 20A and thus prevent the warping of a portion of the finally obtained multi-layer wiring board 10 below at least the third resin insulating layer 23. As a result, it is possible to prevent the warping of the entire multi-layer wiring board 10.

In the core substrate, the thickness of the third resin insulating layer 23 may be in the range of, for example, 0.05 mm to 0.2 mm and the thickness of the metal layer 55 may be in the range of 0.001 mm to 0.035 mm. The metal layer 55 may be made of the same material as the first to seventh conductor layers 11 to 17, including, for example, a conductor with high electrical conductivity, such as copper. The thickness of the other resin insulating layers is in the range of, for example, 0.02 mm to 0.05 mm.

Figure 9:
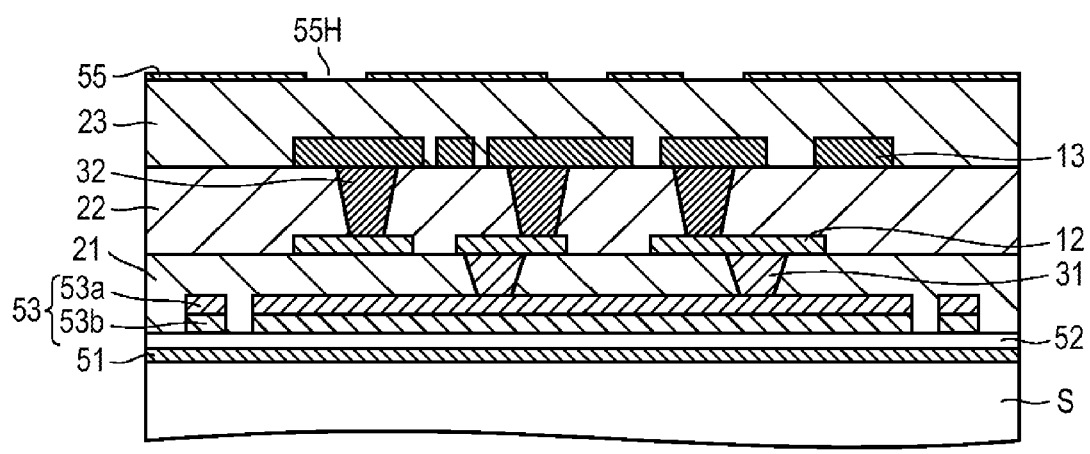
FIG. 9 is a process diagram illustrating the method of manufacturing the multi-layer wiring board according to the embodiment.
Figure 10:
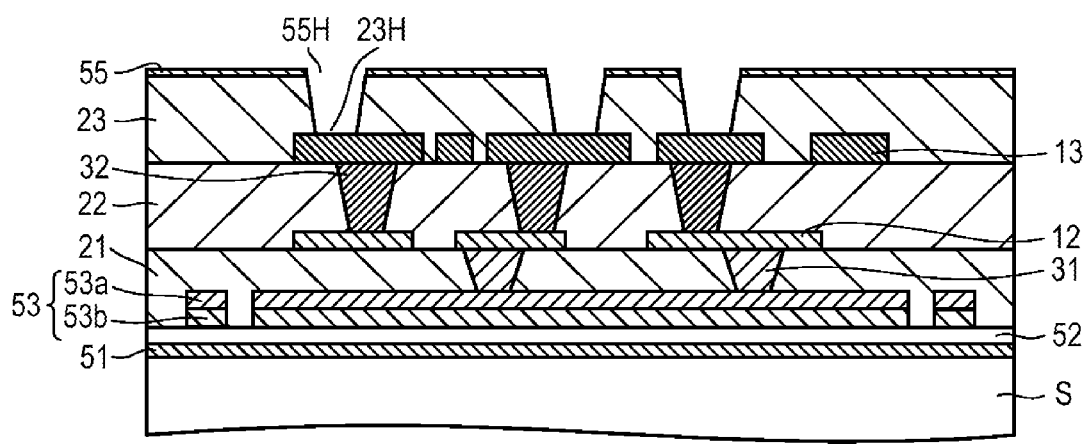
FIG. 10 is a process diagram illustrating the method of manufacturing the multi-layer wiring board according to the embodiment.

Then, as shown in FIG. 9, the metal layer 55 is partially removed by etching to form openings 55H. Then, as shown in FIG. 10, laser light is emitted to the third resin insulating layer 23 through the openings 55H to form through holes 23H such that the third conductor layer 13 is exposed. In this case, in the process shown in FIG. 9, since the openings 55H are formed in advance in portions of the metal layer 55 corresponding to portions of the third resin insulating layer 23 in which the through holes 23H will be formed, the laser light is directly emitted to the third resin insulating layer 23 without passing through the metal layer 55.

When laser light is used to form the through holes 23H in the third resin insulating layer 23 of the core substrate, it is possible to omit a process of forming openings in the metal layer 55 using laser light. Therefore, it is possible to reduce the irradiation energy of laser light required to form the through holes 23H and thus reduce the manufacturing costs of the multi-layer wiring board 10.

The process shown in FIG. 9 may also be omitted. However, in this case, the openings 55H need to be formed in the metal layer 55 by laser light at the same time as the through holes 23H are formed in the third resin insulating layer 23, which results in an increase in the irradiation energy of laser light required to form the through holes 23H. Therefore, the manufacturing costs of the multi-layer wiring board 10 increase. In addition, the formation of the metal layer 55 may be omitted.

The opening 55H may be formed in the metal layer 55 in advance or the formation of the metal layer 55 may be omitted. In this case, it is possible to reduce the irradiation energy of laser light required to form the through holes 23H in the third resin insulating layer 23. However, since the third resin insulating layer 23 is thicker than other resin insulating layers and includes a reinforced fiber, such as a glass fiber, the irradiation energy of laser light required to form the through holes 23H in the third resin insulating layer 23 needs to increase.

However, it is difficult to control the irradiation energy of laser light. In addition, when the irradiation energy of the laser light is more than necessary, the laser light passes through the third resin insulating layer 23 and reaches the third conductor layer 13 and the second resin insulating layer 22 which form the uppermost layer of the first laminated structure 20A provided below the third resin insulating layer 23. As a result, an opening can be formed in the second resin insulating layer 22.

In this case, when the through holes 23H are filled with, for example, a plated layer, which will be described below, the plated layer is also formed in the openings of the second resin insulating layer 22 and is electrically connected to the second conductor layer 12 provided below the second resin insulating layer 22. Therefore, it is difficult to achieve the designed electrical connection of the multi-layer wiring board including the first laminated structure 20A, the third resin insulating layer 23, and the second laminated structure, which will be described below.

However, in this embodiment, the thickness of the third conductor layer 13, which is the uppermost layer of the first laminated structure 20A provided below the third resin insulating layer 23, is greater than that of the other conductor layers of the first laminated structure 20A and the conductor layers of the second laminated structure, which will be described below. Therefore, as described above, even when the irradiation energy of laser light for forming the through holes 23H in the third resin insulating layer 23 is more than necessary, the laser light is shielded by the third conductor layer 13 and does not reach the second resin insulating layer 22. As a result, it is possible to avoid the above-mentioned problem that it is difficult to achieve the designed electrical connection of the multi-layer wiring board.

When the thickness of the third conductor layer 13 increases, the depth of the through hole 23H to be formed in the third resin insulating layer 23 is reduced, which makes it possible to reduce the irradiation energy of laser light for forming the through holes 23H to some extent. That is, the above-mentioned operation and effect can be remarkable due to the synergy between the increase in the thickness of the third conductor layer 13 and the reduction in the intensity of laser light associated with the increase in the thickness.

When the process shown in FIG. 9 is omitted, the openings 55H need to be formed in the metal layer 55 by laser light at the same time as the through holes 23H are formed in the third resin insulating layer 23, which results in an increase in the irradiation energy of laser light required to form the through holes 23H. Therefore, in this case, the operation and effect obtained by increasing the thickness of the third conductor layer 13 become remarkable.

As described above, the thickness of the third conductor layer 13 is equal to or greater than 15 μm and is preferably equal to or less than half the thickness of the third resin insulating layer 23. If the thickness is less than 15 μm, in some cases, it is difficult to sufficiently obtain the above-mentioned operation and effect. If the thickness is greater than half the thickness of the third resin insulating layer 23, a void is likely to be formed at the interface or gap between the third conductor layer 13 and the third resin insulating layer 23 when the third resin insulating layer 23 (specifically, the prepreg) is formed on the third conductor layer 13. In this case, it is difficult to ensure the sufficient insulation of the third resin insulating layer 23.

Figure 11:
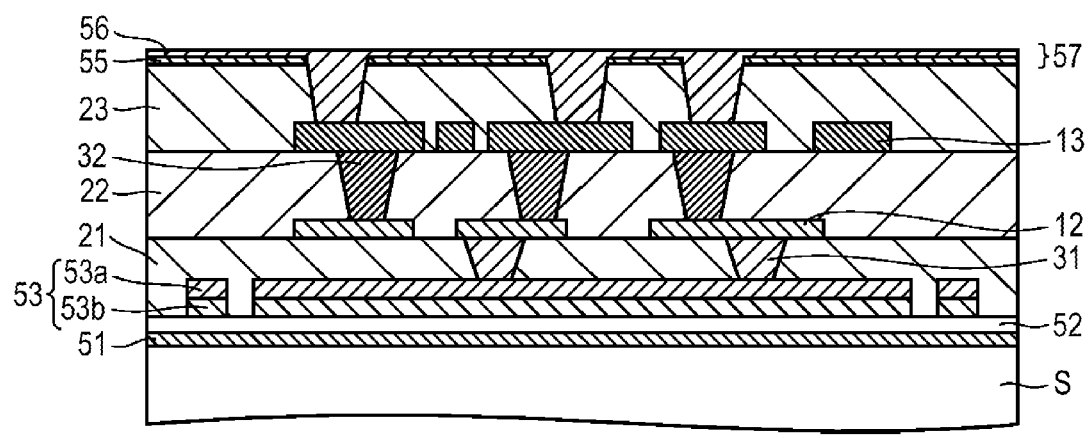
FIG. 11 is a process diagram illustrating the method of manufacturing the multi-layer wiring board according to the embodiment.

Then, a desmear process and an outline etching process are appropriately performed for the through holes 23H. Then, electroless plating is performed to form a plated base layer (not shown) on the inner walls of the through holes 23H. Then, as shown in FIG. 11, a so-called filled via plating process (electrolytic plating process) is performed to fill up the through holes 23H with plating metal. In this case, the plating metal filled in the through hole 23H includes the through hole metal layer formed on the inner circumferential surface of the through hole 23H and functions as the third conductor via 33 which electrically connects the first laminated structure 20A formed on the lower surface of the third resin insulating layer 23 and the second laminated structure 20B formed on the upper surface of the third resin insulating layer 23. Therefore, the length of a wiring line for electrically connecting the laminated structures is reduced and it is possible to prevent, for example, the deterioration of the transmission performance of a high-frequency signal.

In the method of manufacturing the multi-layer wiring board including the core substrate according to the related art, it is necessary to provide through hole conductors in the core substrate in order to electrically connect the laminated structures which are formed on both surfaces of the core substrate. Therefore, it is inevitable that the length of the wiring line for electrically connecting the laminated structures increases and there is a concern that the transmission performance of the high-frequency signal will deteriorate.

When the filled via plating process is performed, the plated layer 56 is also formed on the metal layer 55. A metal laminate in which the plated layer 56 is formed on the metal layer 55 is represented by reference numeral 57. As described above, the metal layer 55 may be made of copper and the plated layer 56 may also be made of copper. Therefore, the plated layer 56 has the same function as the metal layer 55 and the metal laminate 57 may include a single metal layer. When the formation of the metal layer 55 is omitted, reference numeral 57 indicates the plated layer.

Figure 12:
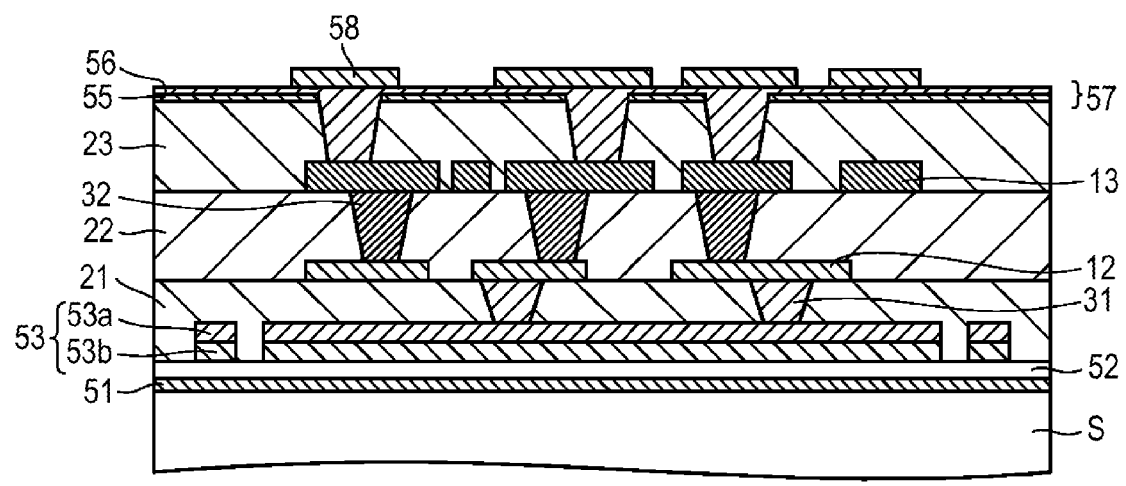
FIG. 12 is a process diagram illustrating the method of manufacturing the multi-layer wiring board according to the embodiment.
Figure 13:
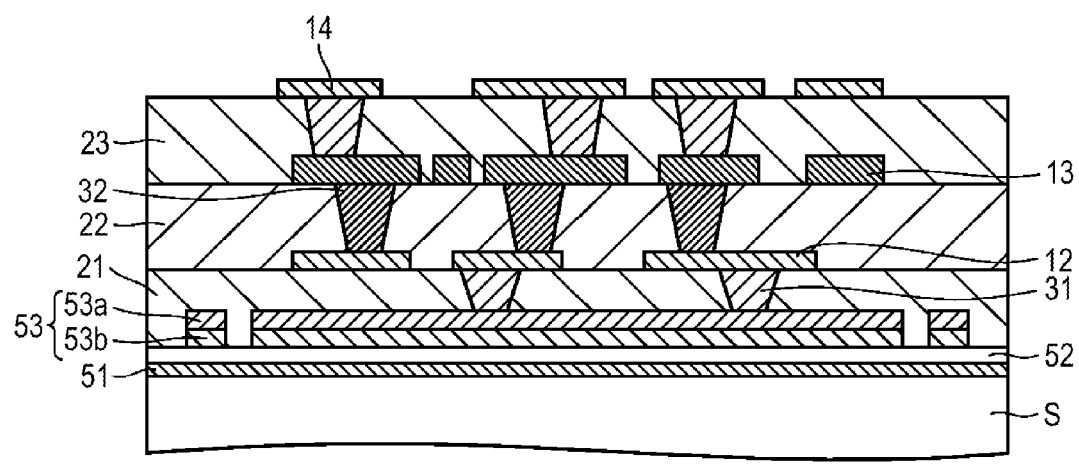
FIG. 13 is a process diagram illustrating the method of manufacturing the multi-layer wiring board according to the embodiment.

Then, as shown in FIG. 12, a resist pattern 58 is formed on the metal laminate (metal layer) 57. Then, as shown in FIG. 13, the metal laminate (metal layer) 57 is etched through the resist pattern 58. Then, the resist pattern 58 is removed and the fourth conductor layer 14 is formed on the third resin insulating layer 23.

Figure 14:
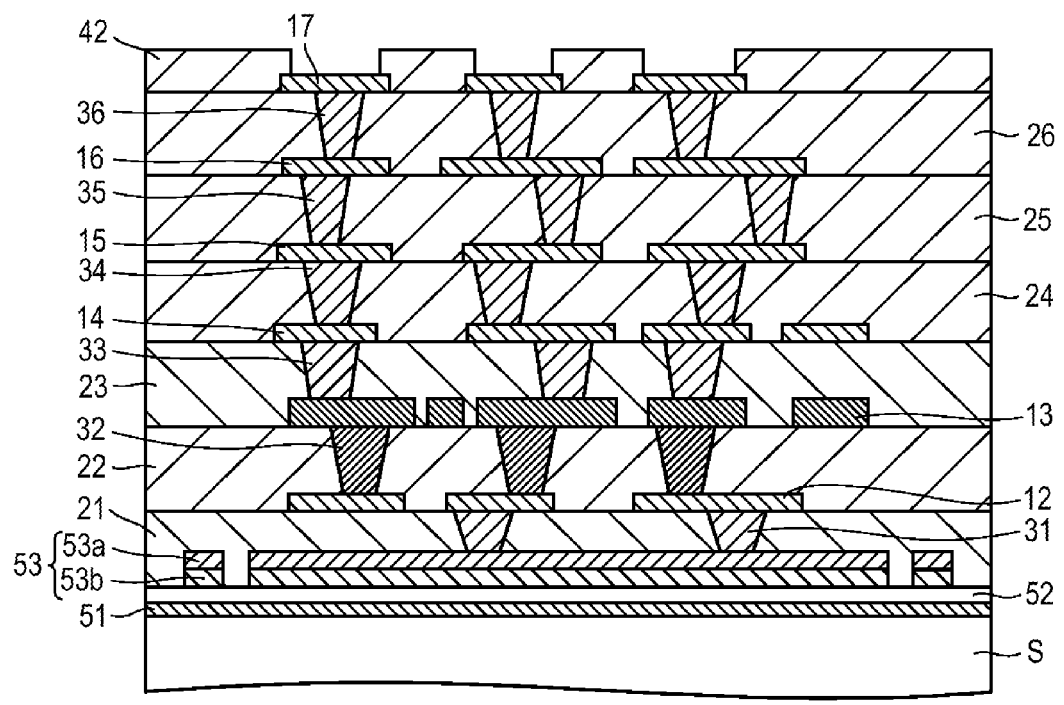
FIG. 14 is a process diagram illustrating the method of manufacturing the multi-layer wiring board according to the embodiment.

Then, a roughening process is performed for the fourth conductor layer 14. Then, as shown in FIG. 14, a resin film is formed on the third resin insulating layer 23 so as to cover the fourth conductor layer 14 and heat and pressure are applied to the resin film under vacuum to harden the resin film. In this way, the fourth resin insulating layer 24 is formed. Then, similarly to the first resin insulating layer 21, via holes are formed in the fourth resin insulating layer 24. Then, pattern plating is performed to form the fifth conductor layer 15 and the fourth via conductor 34. The detailed conditions for forming the fifth conductor layer 15 and the fourth via conductor 34 are the same as those for forming the second conductor layer 12 and the first via conductor 31.

As shown in FIG. 14, the fifth resin insulating layer 25 and the sixth resin insulating layer 26 are sequentially formed, similarly to the fourth resin insulating layer 24. In addition, similarly to the fifth conductor layer 15 and the fourth via conductor 34, the sixth conductor layer 16 and the fifth via conductor 35 are formed on and in the fifth resin insulating layer 25 and the seventh conductor layer 17 and the sixth via conductor 36 are formed on and in the sixth resin insulating layer 26. Then, the second resist layer 42 is formed such that the seventh conductor layer 17 is partially exposed.

The fourth to seventh conductor layers 14 to 17, the fourth to sixth resin insulating layers 24 to 26, and the fourth and fifth via conductors 34 and 35 form the second laminated structure 20B.

Figure 15:
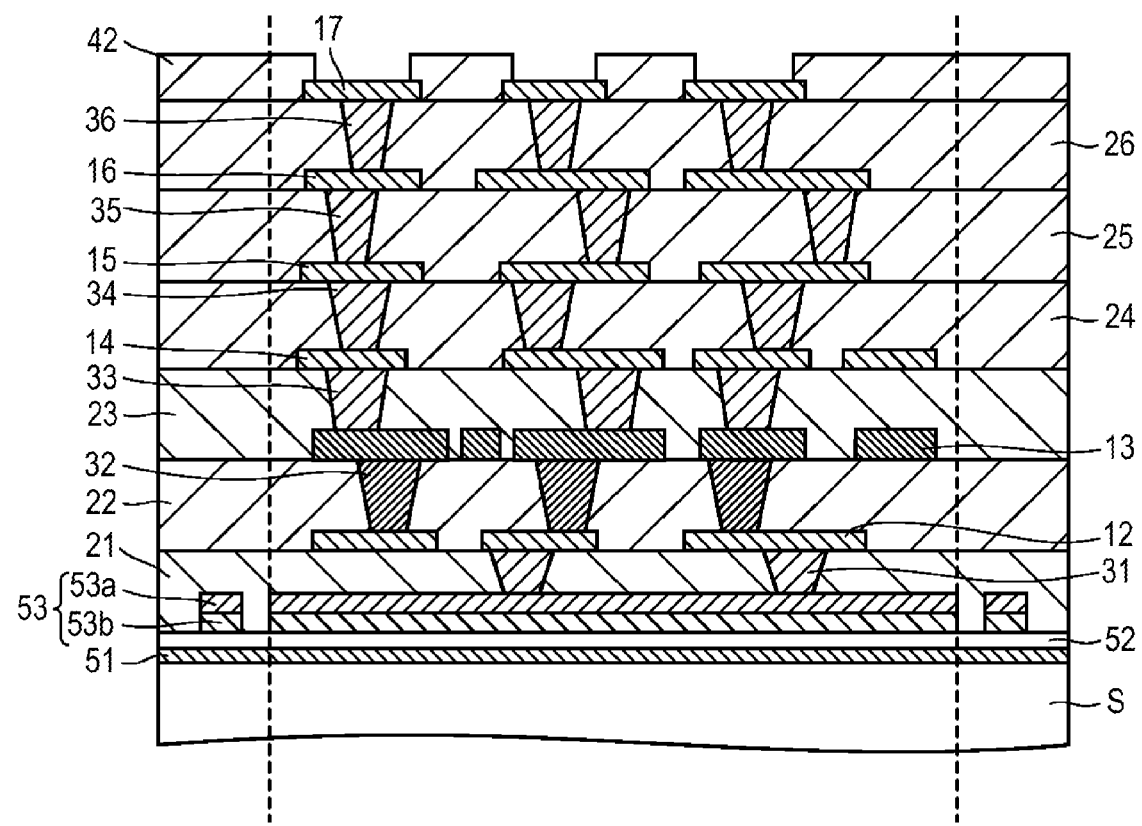
FIG. 15 is a process diagram illustrating the method of manufacturing the multi-layer wiring board according to the embodiment.

Then, as shown in FIG. 15, a laminate of the first laminated structure 20A, the third resin insulating layer 23, and the second laminated structure 20B obtained by the above-mentioned processes is cut along a cutting line which is set slightly inside the outer circumference demarcation portion Po and an unnecessary outer circumferential portion is removed.

Figure 16:
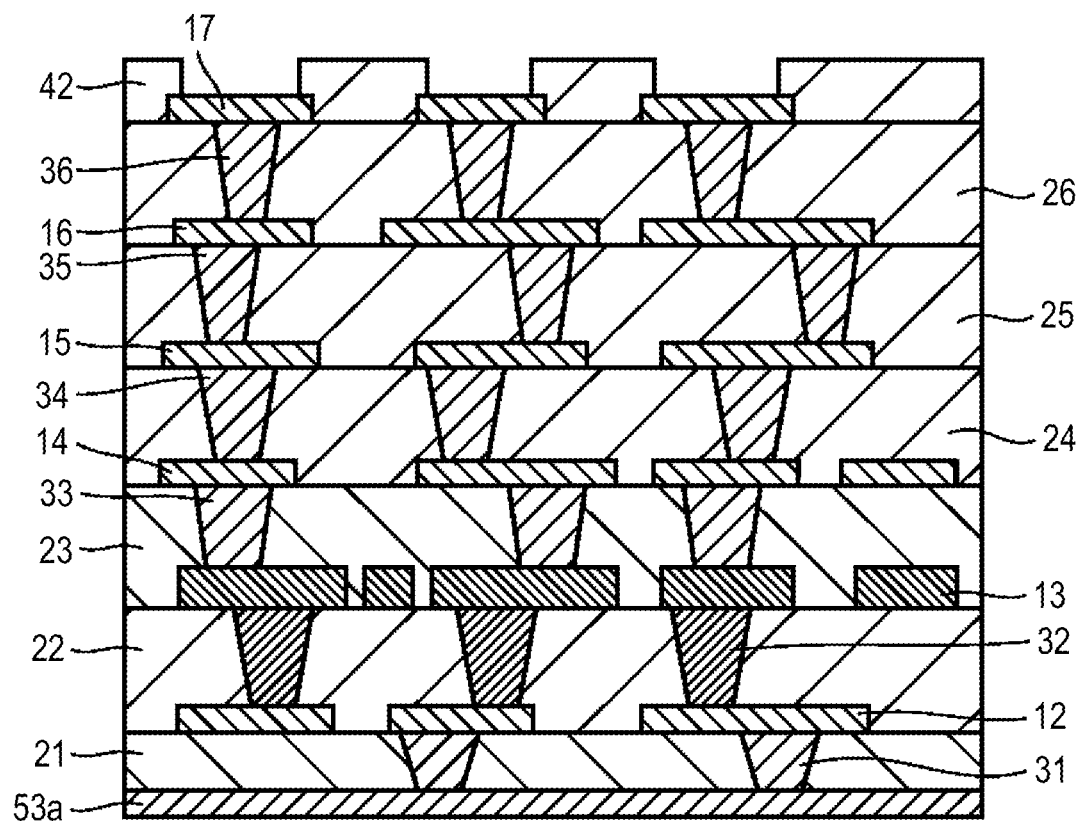
FIG. 16 is a process diagram illustrating the method of manufacturing the multi-layer wiring board according to the embodiment.

Then, as shown in FIG. 16, the release sheet 53 of the multi-layer wiring laminate obtained by the process shown in FIG. 15 peels off at the peeling interface between the first metal film 53a and the second metal film 53b to remove the supporting substrate S from the multi-layer wiring laminate.

Then, etching is performed for the first metal film 53a of the release sheet 53 which remains on the lower side of the multi-layer wiring laminate obtained by the process shown in FIG. 16 to form the first conductor layer 11. Then, the first resist layer 41 is formed such that the first conductor layer 11 is partially exposed. In this way, the multi-layer wiring board 10 shown in FIG. 3 is obtained.

In this embodiment, in the method of manufacturing the so-called coreless multi-layer wiring board in which the laminated structure of at least one conductor layer and at least one resin insulating layer is formed on the supporting substrate, the core substrate is laminated together with the laminated structure and an additional laminated structure having the same structure as the laminated structure is formed on the core substrate. In the method of manufacturing the coreless multi-layer wiring board, after the laminated structure is formed on the supporting substrate as described above, the supporting substrate is removed. Therefore, finally, the core substrate is interposed between the laminated structures each including at least one conductor layer and at least one resin insulating layer, that is, the multi-layer wiring board including the core substrate remains.

In this embodiment, the method of manufacturing the coreless multi-layer wiring board is used to manufacture the multi-layer wiring board 10 including the core substrate (third resin insulating layer 23). Therefore, in the manufacturing process, the first laminated structure 20A, the second laminated structure 20B, and the core substrate are formed on the supporting substrate S. Even when the thickness of the core substrate is small, the thickness of the supporting substrate S is sufficiently large and the strength of the assembly which is being manufactured is not reduced.

Therefore, it is possible to horizontally convey the assembly which is being manufactured and prevent the contact of the assembly with a conveyance mechanism during conveyance. As a result, it is possible to prevent the damage of the core substrate or the assembly. In addition, it is possible to avoid the problem that the assembly is fixed in each manufacturing process and the assembly is bent when it is provided to a predetermined manufacturing process, which makes it difficult to perform, for example, the plating process with high accuracy. Therefore, it is possible to manufacture the multi-layer wiring board 10 including a thin core substrate with high yield and reduce the size of the multi-layer wiring board 10 including the core substrate.

The manufacturing method according to this embodiment is not limited to the manufacture of the multi-layer wiring board including the core substrate in which the core substrate is thin and the core substrate or the assembly which is being manufactured is bent by the general manufacturing method, which results in a reduction in manufacturing yield, but may be applied to a case in which the core substrate is thick and the multi-layer wiring board including the core substrate can be manufactured with a higher yield than that in the general manufacturing method.

In this embodiment, the fourth conductor layer 14 is formed by a so-called subtractive method. However, the fourth conductor layer 14 may be formed by a semi-additive method instead of the subtractive method.

In the process shown in FIG. 11, the filled via plating process is performed for the through hole 23H of the third resin insulating layer 23 to fill the through hole 23H with the plated layer. However, a through plating process may be performed for the through holes 23H to form the plated layer (through hole metal layer) on the inner wall of the through hole 23H such that the plated layer is connected to the metal layer 55. Then, the through hole in which the plated layer is formed may be filled with the resin film used to form the fourth resin insulating layer 24, that is, an insulating layer.

Figure 17:
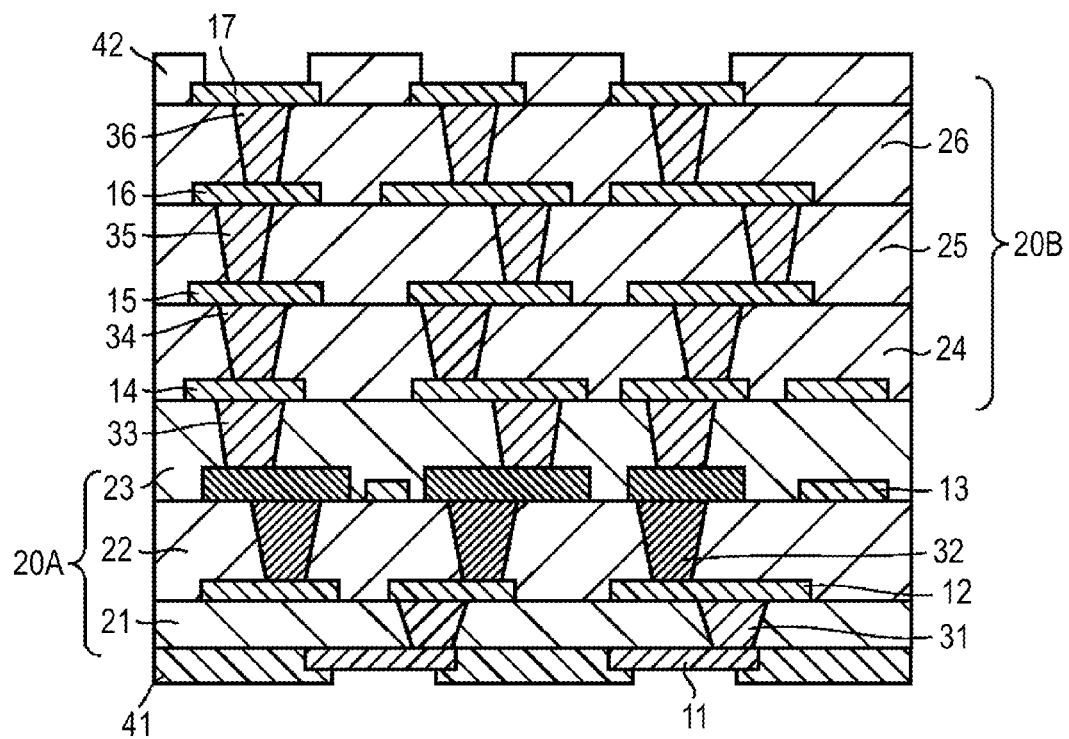
FIG. 17 is a process diagram illustrating a modification of the method of manufacturing the multi-layer wiring board according to the embodiment.

FIG. 17 is a diagram illustrating a modification of the manufacturing method according to the above-described embodiment. In this modification, the third conductor layer 13 which is the uppermost layer of the first laminated structure 20A is formed only in a region which is disposed immediately below a portion of the third resin insulating layer 23 in which the through hole 23H will be formed. In this case, only a portion which comes into contact with the plated layer formed in the through hole 23H, that is, only a pad portion, may be formed to be thick. Therefore, it is possible to easily design the circuit of the multi-layer wiring board including the first laminated structure, the core substrate, and the second laminated structure.

The plating process is performed plural times only for the region in order to form the thick third conductor layer 13 only in the region.

The embodiment of the invention has been described in detail above, but the invention is not limited to the above-mentioned content. Various modifications or changes of the invention can be made without departing from the scope of the invention.

In the method of manufacturing the multi-layer wiring board according to the above-described embodiment, after the supporting substrate S is removed, the first resist layer 41 and the second resist layer 42 are formed to obtain the multi-layer wiring board 10. However, when a new multi-layer structure is formed, the method may include a process of forming a conductor layer and a resin insulating layer on the surfaces of the first laminated structure 20A and the second laminated structure 20B after the supporting substrate S is removed.

In the method of manufacturing the multi-layer wiring board according to the above-described embodiment, the conductor layers and the resin insulating layers are sequentially formed from the conductor layer which functions as the rear land for connection to the motherboard to the conductor layer which functions as the pad (FC pad) for flip-chip interconnection to, for example, a semiconductor element. However, the order in which the layers are formed is not particularly limited. For example, the conductor layers and the resin insulating layers may be formed from the conductor layer which functions as the FC pad to the conductor layer which functions as the rear land.

In the method of manufacturing the multi-layer wiring board according to the above-described embodiment, the multi-layer wiring board 10 includes one core substrate. However, the number of core substrates is not particularly limited. For example, a plurality of core substrates may be formed for purposes. When a plurality of core substrates are formed, the thickness of the conductor layer which is disposed immediately below the core substrate may be set to be equal to that of the third conductor layer 21 of the above-described embodiment. In this case, the same effect as that of the above-described embodiment is obtained.

What is claimed is:

1. A method of manufacturing a multi-layer wiring board, comprising:
   forming, on a supporting substrate, a first laminated structure in which at least one conductor layer and at least one resin insulating layer are alternately formed;
   forming a core substrate on the first laminated structure so as to come into contact with a conductor layer which is an uppermost layer of the first laminated structure;
   forming a through hole in the core substrate on which a metal layer is provided on its upper main surface by emitting laser light to the core substrate;
   removing a portion of the metal layer which is disposed immediately above a portion of the core substrate in which the through hole will be formed before the laser light is emitted to the core substrate;
   forming a through hole metal layer on at least an inner circumferential surface of the through hole;
   forming a second laminated structure in which at least one conductor layer and at least one resin insulating layer are alternately formed on the core substrate having the through hole metal layer formed thereon; and
   removing the supporting substrate from the first laminate structure,
   wherein a thickness of the conductor layer which is the uppermost layer of the first laminated structure is greater than a thickness of other conductor layers.

2. The method of manufacturing a multi-layer wiring board according to claim 1,
   wherein the thickness of the conductor layer which is the uppermost layer of the first laminated structure is equal to or greater than 15 µm and is equal to or less than half the thickness of the core substrate.

3. The method of manufacturing a multi-layer wiring board according to claim 1,
   wherein the conductor layer which is the uppermost layer of the first laminated structure is disposed only in a region corresponding to a portion of the core substrate in which the through hole will be formed.

* * * * *